(12) United States Patent
Yang et al.

(10) Patent No.: US 8,500,182 B2
(45) Date of Patent: Aug. 6, 2013

(54) VACUUM WAFER CARRIERS FOR STRENGTHENING THIN WAFERS

(75) Inventors: Ku-Feng Yang, Dali (TW); Weng-Jin Wu, Hsin-Chu (TW); Jing-Cheng Lin, Hsin-Chu (TW); Wen-Chih Chiou, Miaoli (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/818,022

(22) Filed: Jun. 17, 2010

(65) Prior Publication Data

US 2011/0309647 A1    Dec. 22, 2011

(51) Int. Cl.
*B25J 15/00*    (2006.01)

(52) U.S. Cl.
USPC ............................ 294/188; 294/213; 414/941

(58) Field of Classification Search
USPC .......... 294/64.1, 183, 188, 213, 189; 414/941
See application file for complete search history.

(56) References Cited

U.S. PATENT DOCUMENTS

| | | | |
|---|---|---|---|
| 5,149,162 A * | 9/1992 | Focke et al. | 294/188 |
| H1373 H * | 11/1994 | Durham et al. | 414/800 |
| 5,391,917 A | 2/1995 | Gilmour et al. | |
| 5,510,298 A | 4/1996 | Redwine | |
| 5,564,682 A * | 10/1996 | Tsuji | 269/21 |
| 5,669,644 A * | 9/1997 | Kaihotsu et al. | 294/213 |
| 5,767,001 A | 6/1998 | Bertagnolli et al. | |
| 5,911,461 A * | 6/1999 | Sauter et al. | 294/213 |
| 5,998,292 A | 12/1999 | Black et al. | |
| 6,184,060 B1 | 2/2001 | Siniaguine | |
| 6,232,578 B1 * | 5/2001 | Klebanoff et al. | 219/228 |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |

(Continued)

*Primary Examiner* — Saul Rodriguez
*Assistant Examiner* — Gabriela Puig
(74) *Attorney, Agent, or Firm* — Slater & Matsil, L.L.P.

(57) ABSTRACT

An apparatus for supporting a wafer includes a base, and a gas-penetration layer. The gas-penetration layer and a portion of the base directly underlying the gas-penetration layer form a gas passage therebetween. The gas passage is configured to be sealed by the wafer placed directly over the gas-penetration layer. The apparatus further includes a valve connected to the gas passage.

15 Claims, 6 Drawing Sheets

U.S. PATENT DOCUMENTS

| | | |
|---|---|---|
| 7,297,574 B2 | 11/2007 | Thomas et al. |
| 7,335,972 B2 | 2/2008 | Chanchani |
| 7,355,273 B2 | 4/2008 | Jackson et al. |
| 2003/0052495 A1* | 3/2003 | Casarotti et al. ............. 294/64.1 |
| 2003/0173790 A1* | 9/2003 | Hartog ........................ 294/64.1 |

* cited by examiner

VACUUM WAFER CARRIERS FOR STRENGTHENING THIN WAFERS

TECHNICAL FIELD

This disclosure relates generally to apparatuses for forming integrated circuits, and more particularly to vacuum wafer carriers for strengthening thin wafers.

BACKGROUND

Integrated circuits are formed on semiconductor wafers. The semiconductor wafers are then sawed into chips. The formation of integrated circuits includes many process steps such as deposition, chemical mechanical polish (CMP), plating, and the like. Accordingly, wafers are transported between different equipments.

A challenge faced by integrated manufacturing industry is that to improve cost efficiency, wafers become increasingly larger. In the meantime, wafers also become increasingly thinner. Furthermore, in the manufacturing of integrated circuits, wafers may need to be thinned. For example, in 3DIC technology, wafer thinning is used to thin down wafers to expose through-substrate vias (TSVs) formed therein, wherein the TSVs are important components for wafer/die stacking. However, handling such kind of thin wafers is very difficult. For example, the thin wafers suffer from breakage, particularly during the transportation and the CMP process, during which mechanical stress may be applied to the wafers.

To reduce the likelihood of breakage, thin wafers may need to be strengthened. FIGS. 1A through 1C illustrate cross-sectional views of intermediate stages in a conventional wafer thinning process, in which a thin wafer is strengthened. Referring to FIG. 1A, wafer 2 is bonded to carrier 6, which may be a glass carrier, through adhesive 4. Therefore, wafer 2 is supported mechanically by carrier 6. In FIG. 1B, a wafer thinning (grinding or CMP) process is performed to reduce the thickness of wafer 2. Thin wafer 2 is mechanically stronger due to the support of carrier 6. After the wafer thinning process, wafer 2 is de-bonded from carrier 6, as shown in FIG. 3. This wafer-supporting method, however, cannot be used in various manufacturing processes such as those requiring elevated temperatures. The reason is that adhesive 4 may not be able to endure the elevated temperatures. Further, in processes involving chemicals, for example, in wet etching processes, adhesive 4 may be attacked by the chemicals. Therefore, the usage of the method as shown in FIGS. 1A through 1C is limited.

FIG. 2 illustrates an alternative method for strengthening thin wafers. Mobile electrostatic carrier 8 is adapted to generate static charges, so that wafer 2 may be attracted onto mobile electrostatic carrier 8. Wafer 2 and mobile electrostatic carrier 8 may be transported and used in various process steps as a single unit. Therefore, mobile electrostatic carrier 8 provides mechanical support to wafer 2 during these process steps. To maintain the charges, however, mobile electrostatic carrier 8 needs to be periodically recharged, and hence the cost is high.

There are some other methods for strengthening wafers. For example, referring to FIG. 3, Teflon ring 10 (having a shape of ring in a top view) may be clamped onto the edge of thin wafer 2, and Teflon ring 10 and thin wafer 2 may be transported and processed as a single unit. However, no CMP can be performed to thin wafer 2 even if Teflon ring 10 is attached onto thin wafer 2.

An additional method for transporting thin wafers is shown in FIG. 4, wherein clean dry air or nitrogen (symbolized by arrows) may be blown into robot panel 14, so that wafer 2 is pushed away from a wafer holder of the robot panel for a desirable distance such as about 300 μm to about 400 μm. Wafer 2 is thus suspended in the air. Therefore, no-touch transportation is achieved. The method shown in FIG. 4, however, cannot be used to support thin wafers during integrated circuit manufacturing processes.

SUMMARY

In accordance with one aspect, an apparatus for supporting a wafer includes a base, and a gas-penetration layer. The gas-penetration layer and a portion of the base directly underlying the gas-penetration layer form a gas passage therebetween. The gas passage is configured to be sealed by the wafer placed directly over the gas-penetration layer. The apparatus further includes a valve connected to the gas passage.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel vacuum wafer carrier is provided in accordance with various embodiments. The variations and the operation of the embodiments are discussed. Throughout the various views and illustrative embodiments, like reference numbers are used to designate like elements.

Figure 1A:
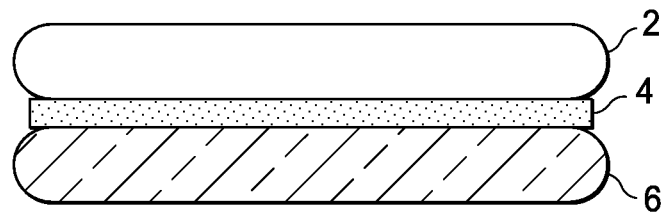
FIG. 1A through 4 illustrate various conventional methods for transporting and/or supporting wafers.
Figure 1B:
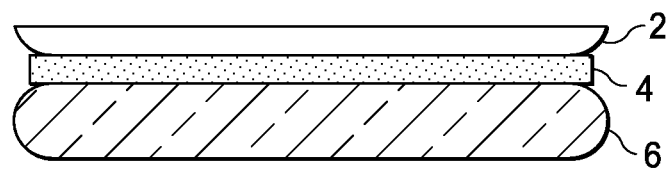
Figure 1C:
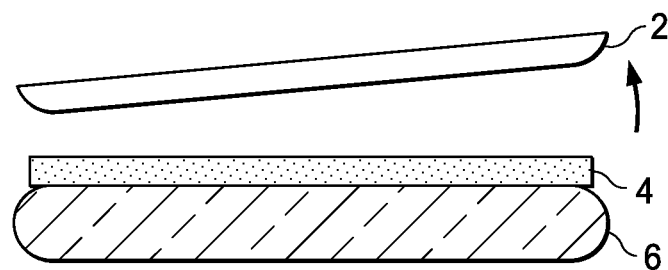
Figure 2:
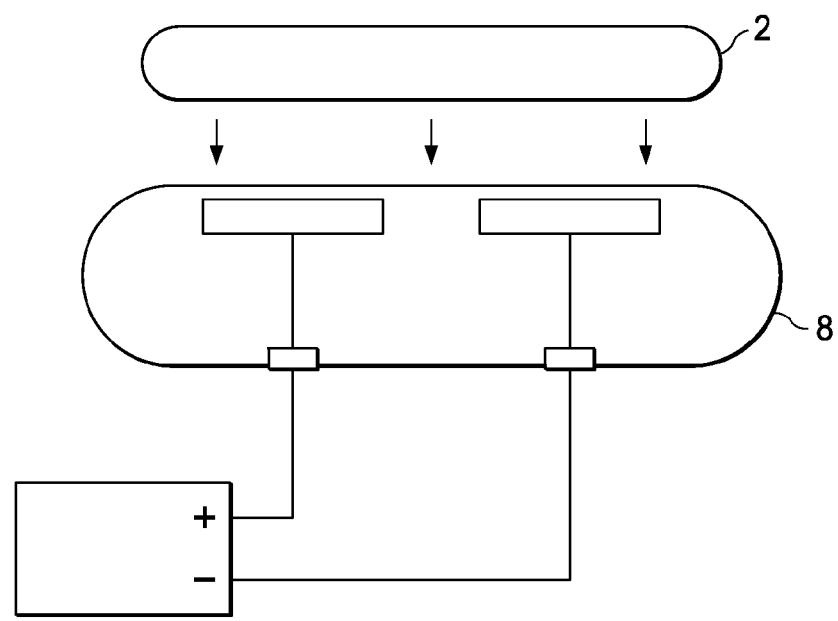
Figure 3:
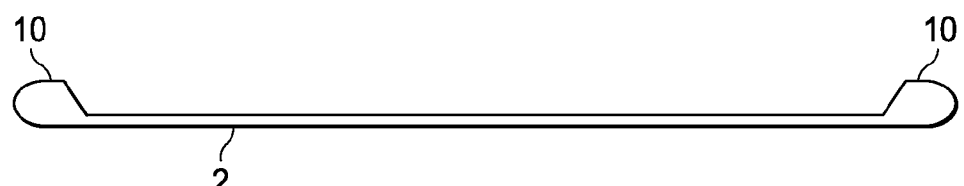
Figure 4:
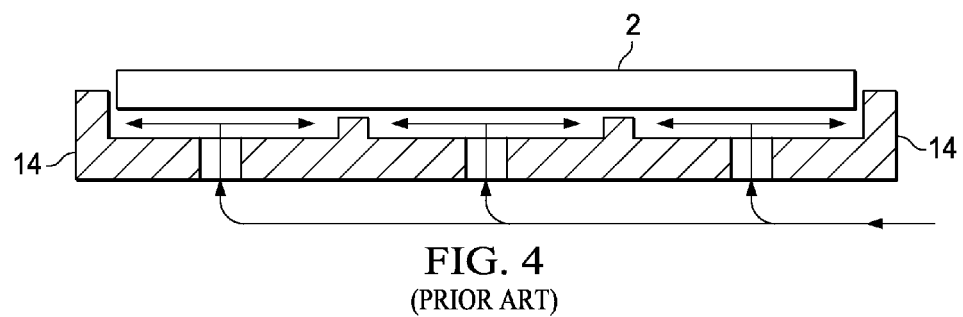
Figure 5A:
FIGS. 5A through 5C illustrate vacuum wafer carriers in accordance with various embodiments.

FIG. 5A illustrates a cross-section view of vacuum wafer carrier 20. Vacuum wafer carrier 20 includes base 22 (including portions 22A, 22B, and 22C), and gas-penetration layer 24. Base portion 22A is directly under gas-penetration layer 24, and is vertically spaced apart from gas-penetration layer 24 by gas passage 28, which is a space filled with air (or vacuumed). Base portion 22B encircles gas-penetration layer 24 and gas passage 28 from sides, and joins gas-penetration layer 24 with no gap therebetween. Base 22 may be formed of non-porous materials that may effectively prevent gases from penetrating through. Gas passage 28 may have a circular shape in a top view. In an exemplary embodiment, base 22 is formed of ceramic. In alternative embodiments, base 22 may be formed of other materials such as Teflon, metal, or composite material such as metal coat with Teflon or ceramic coated with Teflon.

The top surface of gas-penetration layer 24 may be lower than rim portion 22C of base 22, wherein rim portion 22C forms a ring encircling, and it is higher than, gas-penetration layer 24. Rim portion 22C further encircles recess 36 that is formed directly over gas-penetration layer 24. Further, a curved edge(s) 38 may be formed on the inner side of rim portion 22C, with the inner side facing the center of vacuum wafer carrier 20. In some embodiments, in the direction perpendicular to a circular parameter of rim portion 22C, the slope of the inner edge 38 of rim portion 22C gradually and continuously reduces from a top of the respective inner edge 38 to a bottom of the inner edge 38. In alternative embodiments, edges 38 may be slant straight edges.

Figure 5B:
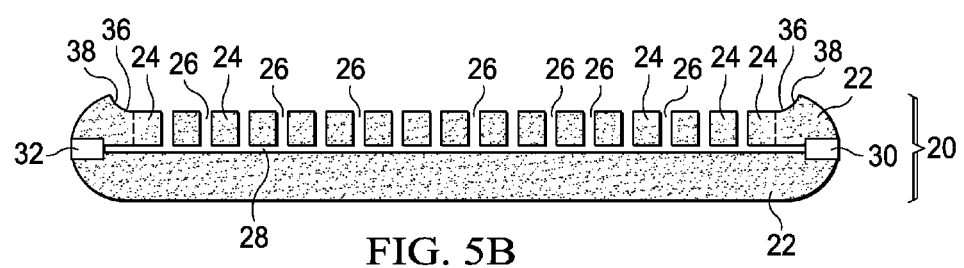

In an embodiment, gas-penetration layer 24 is formed of a porous (permeable) material such as a porous ceramic, which includes pores therein, so that gases such as air, nitrogen, or the like, may penetrate through the pores in gas-penetration layer 24. In alternative embodiments, as shown in FIG. 5B, gas-penetration layer 24 may include a plurality of holes 26. Therefore, gas passage 28 may be connected to, and may exchange gases with, external environment through the pores or holes 26. In the embodiment shown in FIG. 5B, gas-penetration layer 24 may be formed of a non-porous material such as non-porous ceramic, which by itself does not allow gas to penetrate if there is no hole. Alternatively, gas-penetration layer 24 may be formed of a porous material such as porous ceramic, with additional holes 26 in the porous material. In the embodiments shown in FIG. 5B, gas-penetration layer 24 may be formed of a same material as that of base 22, although they can also be formed of different materials.

Figure 6A:
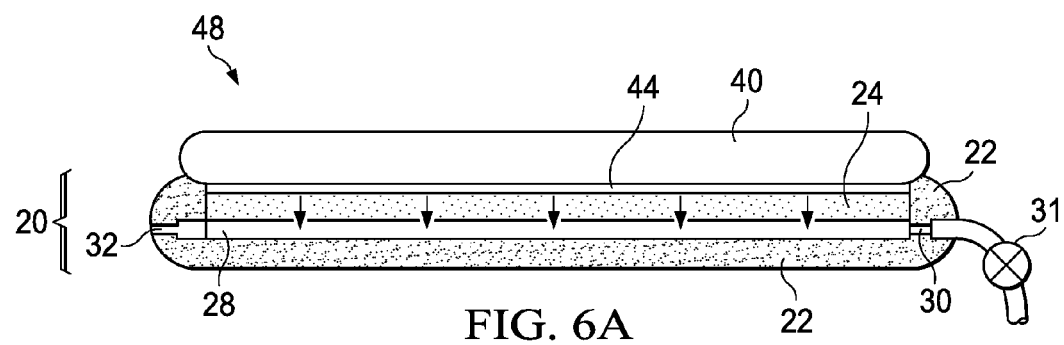
FIGS. 6A and 6B are cross-sectional views of wafers bonded onto vacuum wafer carriers.
Figure 6B:
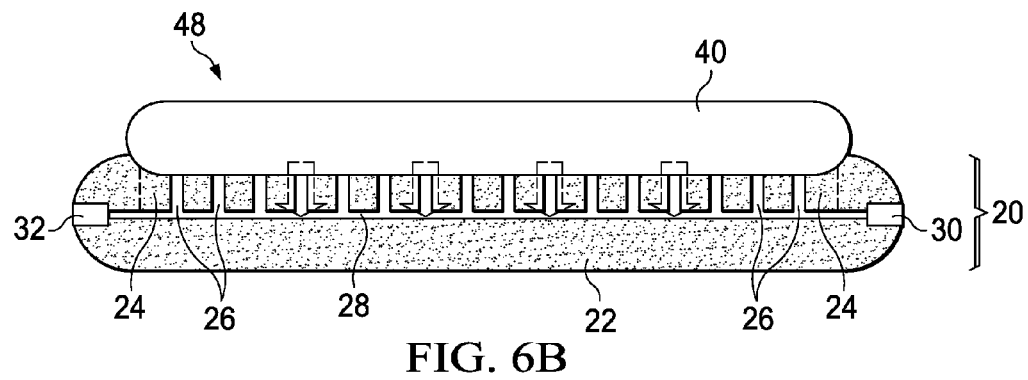

Gas passage 28 is also connected to external environment through valve 30, which may be used to seal gas passage 28 and holes 26 (when a wafer is placed on gas-penetration layer 24, as shown in FIGS. 6A and 6B) to generate a vacuum environment, or release vacuum by allowing gases to flow into gas passage 28 and holes 26. In alternative embodiment, an additional valve 32 is connected to gas passage 28, so that valve 30 may be used for vacuuming, while valve 32 may be used for releasing vacuum.

Figure 5C:
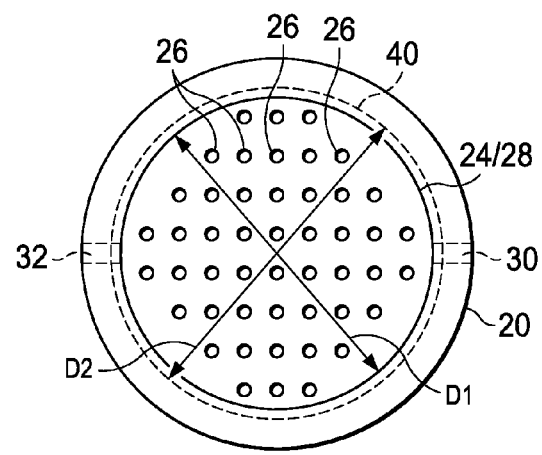

FIG. 5C illustrates an exemplary top view of the structure shown in FIG. 5B. It illustrates a plurality of holes 26 distributed throughout gas-penetration layer 24. The plurality of holes 26 may be distributed substantially uniformly, for example, as an array, or in any other pattern such as a radius pattern, a spiral pattern, or the like. FIG. 5C also illustrates wafer 40 that is to be placed on gas-penetration layer 24, wherein wafer 40 is illustrated using dotted lines. Gas-penetration layer 24 may have a circular shape, wherein diameter D1 of gas-penetration layer 24 may be slightly smaller than, but close to, diameter D2 of wafer 40, for example, with the difference between diameters D1 and D2 less than 5 percent of any of diameters D1 and D2.

Referring to FIG. 6A, wafer 40 is placed on gas-penetration layer 24, with a portion of wafer 40 being in recess 36 (not shown in FIG. 6A, please refer to FIGS. 5A and 5B). With curved edge 38 (FIGS. 5A and 5B), wafer 40 may be self-aligned to a center of vacuum wafer carrier 20. Further, the edges of wafer 40 are also protected by rim portion 22C of base 22. Wafer 40 may be a thin wafer having a thickness, for example, less than about 30 μm, or even less than about 20 μm, although thick wafers can also be used. In an embodiment wherein the front side of wafer 40 faces down, since the front side of wafer 40 may include patterns and devices that need to be protected, tape 44 may be pre-attached on wafer 40 before wafer 40 is placed on vacuum wafer carrier 20 to protect the devices and patterns. In alternative embodiments, for example, when the backside of wafer 40 faces down, no tape is placed, and wafer 40 contacts gas-penetration layer 24.

Base 22, gas-penetration layer 24, valve 30/32, and wafer 40 may form a fully enclosed environment that can be vacuumed. The gases such as air in passage 28, gas-penetration layer 24, and holes 26 (FIG. 6B) is then pumped out through valve 30 using pump 31 (FIG. 6A), so that a vacuum environment is generated in vacuum wafer carrier 20. As a result, wafer 40 is bonded to gas-penetration layer 24 by the pressure difference between the internal vacuum environment and the external environment, which pressure difference is caused by the vacuum in vacuum wafer carrier 20. Throughout the description, vacuum wafer carrier 20 and wafer 40 placed thereon in combination are referred to as wafer-carrier unit 48. As long as the vacuum environment in vacuum wafer carrier 20 is maintained, wafer-carrier unit 48, as a single unit, may be transported and go through different integrated circuit manufacturing process steps, during which wafer 40 is mechanically supported by vacuum wafer carrier 20. FIG. 6B illustrates wafer-carrier unit 48 in which gas-penetration layer 24 includes holes 26 therein.

Figure 7:
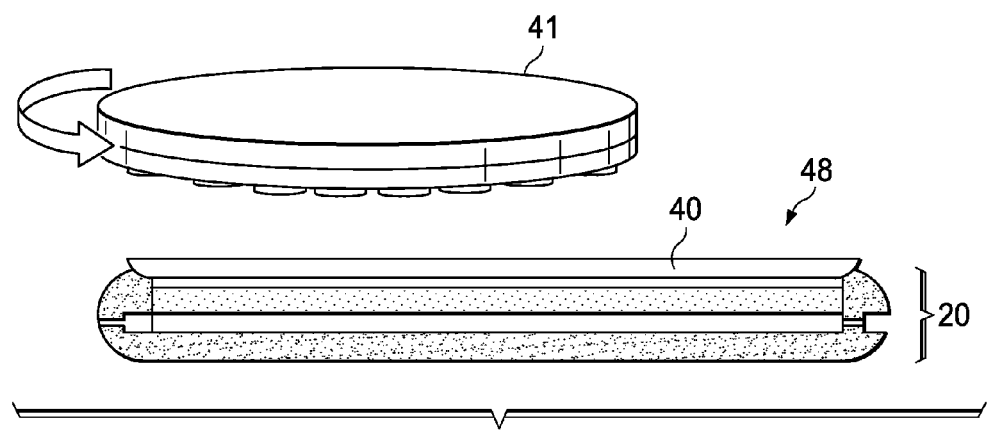
FIG. 7 illustrates a planarization performed on a wafer bonded to a vacuum wafer carrier.

Next, as shown in FIG. 7, a grinding is performed on wafer 40, which now becomes a part of wafer-carrier unit 48. The backside of wafer 40 may be grinded using grinding head 41 to reduce the thickness of wafer 40. During the grinding, vacuum wafer carrier 20 supports wafer 40 and prevents it from breaking. In alternative embodiments, wafer-carrier unit 48 may be sent for a planarization process such as a chemical mechanical polish (CMP) process, during which a CMP is performed on wafer 40. In yet other embodiments, wafer-carrier unit 48 may be sent for a deposition step to deposit a film(s) on wafer 40, during which wafer-carrier unit 48 is placed into respective deposition chambers.

Figure 8:
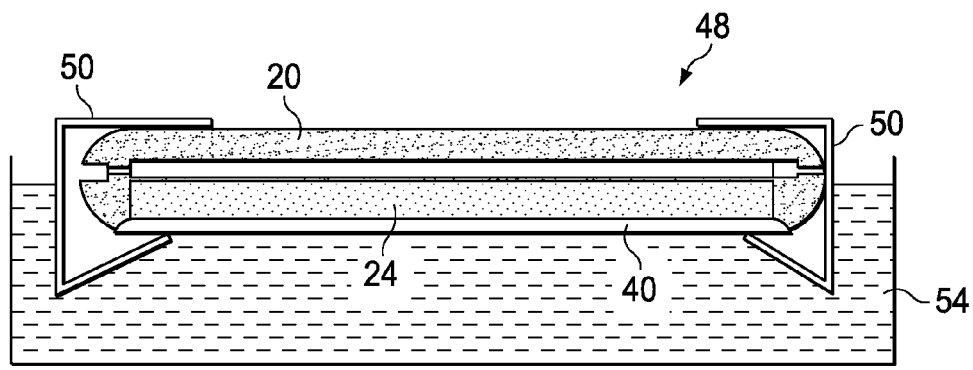
FIG. 8 illustrates a wet etching step performed on a wafer bonded to a vacuum wafer carrier.

Referring to FIG. 8, clamp 50 is attached onto wafer-carrier unit 48, and a wet process may be performed on wafer 40 by submerging wafer-carrier unit 48 into solution 54. To perform a wet etching, solution 54 may include an etchant therein. To perform a plating process such as an electro or an electroless plating, solution 54 may be a plating solution.

Figure 9:
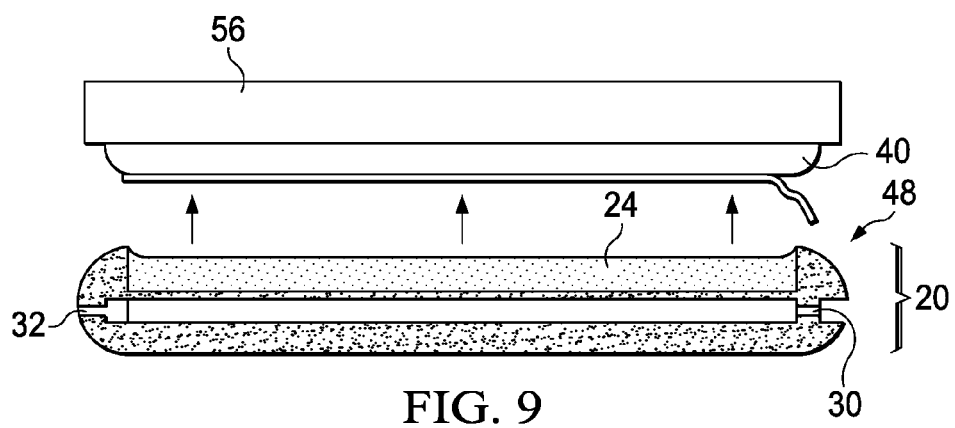
FIG. 9 illustrates the de-bonding of a thin wafer from a vacuum wafer carrier.
Figure 10:
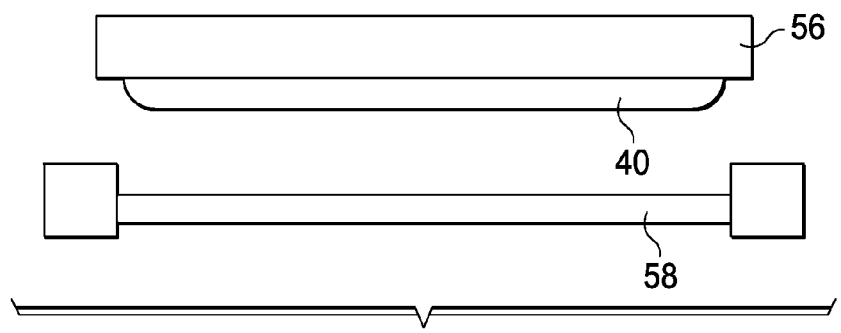
FIG. 10 illustrates a wafer being transported to a dicing tape by a robot panel.

After the desirable transportation and/or manufacturing processes, wafer 40 may be detached from vacuum wafer carrier 20. For example, referring to FIG. 9, robot panel 56 of a vacuum robot (not shown) is pressed against wafer 40. The vacuum in vacuum wafer carrier 20 is then released through valve 30 or 32 by allowing gases such as clean air to flow into vacuum wafer carrier 20. During the vacuum release step, robot panel 56 may be pressed against wafer 40 to prevent the gases flowing into vacuum wafer carrier 20 from breaking wafer 40. After the vacuum is released, robot panel 56 may lift wafer 40 away from vacuum wafer carrier 20. Vacuum wafer carrier 20 may then be reused to support another wafer. As shown in FIG. 10, after releasing wafer 40 from vacuum wafer carrier 20, wafer 40 may be attached on dicing tape 58, so that a die sawing may be performed.

Vacuum wafer carrier unit 48 may be transferred to a wafer storage, for example a front opening unified pod (FOUP, not shown). The FOUP may include an apparatus (not shown) for periodically pumping out gases from vacuum wafer carrier 20 to maintain the vacuum. This may ensure that if the storage time is longer than certain threshold time (Q time), the vacuum can still be maintained.

In the embodiments, by using vacuum wafer carriers, thin wafers can be properly supported during transportation, storage, and various integrated circuit manufacturing processes.

Since no adhesive is needed to bond wafers onto vacuum wafer carriers, the wafer-carrier units do not suffer from thermal budget limitations, and is not prone to the damage caused by the chemicals that are used in various process steps. Further, the cost is low due to the reusability of the vacuum wafer carriers.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus for supporting a wafer, the apparatus comprising:
   a base;
   a gas-penetration layer of a circular shape, wherein the gas-penetration layer and a portion of the base directly underlying the gas-penetration layer form a gas passage therebetween, and wherein the gas passage is configured to be sealed by the wafer placed directly over the gas-penetration layer, and a diameter of the gas-penetration layer is slightly smaller than a diameter of the wafer placed on the gas-penetration layer;
   a rim portion of the base encircling the gas-penetration layer, wherein the rim portion has a top end higher than a top surface of the gas-penetration layer, the rim portion is configured such that a wafer, when placed on the rim portion, is in contact with and supported solely by an inner edge of the rim portion;
   and
   a valve connected to the gas passage.

2. The apparatus of claim 1, wherein the diameter of the gas-penetration layer is about 5% less than the diameter of the wafer placed on the gas-penetration layer.

3. The apparatus of claim 2, wherein the inner edge of the rim portion is curved continuously in a direction perpendicular to a circular parameter of the rim, with a slope of the inner edge gradually and continuously reducing from a top of the inner edge to a bottom of the inner edge.

4. The apparatus of claim 1, wherein the gas-penetration layer comprises a porous material.

5. The apparatus of claim 4, wherein the porous material comprises a porous ceramic.

6. The apparatus of claim 1, wherein the gas-penetration layer comprises a hole extending from a top surface of the gas-penetration layer down to the gas passage.

7. The apparatus of claim 1, wherein the valve is disposed in the base.

8. The apparatus of claim 1, wherein the base is formed of a material comprising ceramic.

9. The Apparatus of claim 1, wherein the diameter of the gas-penetration layer is about 5% less than the diameter of the wafer placed on the gas-penetration layer, and a top surface of the wafer placed on the gas-penetration layer is higher than the top end of the rim portion of the base.

10. An apparatus for supporting a wafer, the apparatus comprising:
    a gas-penetration layer of a circular shape configured to allow air to pass through, wherein a diameter of the gas-penetration layer is slightly smaller than a diameter of the wafer placed on the gas-penetration layer;
    a base comprising:
       a first portion directly underlying the gas-penetration layer, wherein the first portion of the base is vertically spaced apart from the gas-penetration layer by a gas passage;
       a second portion encircling the gas-penetration layer and the gas passage; and
       a third portion over the second portion and encircling the gas-penetration layer, wherein the third portion is higher than a top surface of the gas-penetration layer, wherein an inner edge of the third portion of the base is curved continuously in a direction perpendicular to a circular parameter of the third portion of the base, with a slope of the inner edge gradually and continuously reducing from a top to a bottom of the inner edge of the third portion of the base, and the third portion is configured such that a wafer, when placed on the third portion, is in contact with and supported solely by the inner edge of the third portion; and
    a valve connected to the gas passage.

11. The apparatus of claim 10, wherein a size of the gas-penetration layer is configured to allow the wafer placed directly over the gas-penetration layer to seal the gas passage.

12. The apparatus of claim 11, wherein the gas-penetration layer has a circular shape, and a diameter of the gas-penetration layer is about 5% less than a diameter of the wafer placed on the gas-penetration layer.

13. The apparatus of claim 10, wherein the gas-penetration layer comprises a porous material, and wherein the base is formed of a non-porous material.

14. The apparatus of claim 10, wherein the gas-penetration layer comprises a plurality of holes extending from the top surface of the gas-penetration layer down to the gas passage.

15. The apparatus of claim 10, wherein the apparatus is configured so that a vacuum environment is maintained in the gas passage without a pump attached to the base.

* * * * *